United States Patent [19]
Fant

[11] Patent Number: 6,052,770
[45] Date of Patent: *Apr. 18, 2000

[54] ASYNCHRONOUS REGISTER

[75] Inventor: Karl Fant, Minneapolis, Minn.

[73] Assignee: Theseus Logic, Inc., Orlando, Fla.

[ * ] Notice: This patent issued on a continued prosecution application filed under 37 CFR 1.53(d), and is subject to the twenty year patent term provisions of 35 U.S.C. 154(a)(2).

[21] Appl. No.: 08/901,207

[22] Filed: Jul. 28, 1997

Related U.S. Application Data

[62] Division of application No. 08/318,508, Oct. 5, 1994, Pat. No. 5,652,902, which is a continuation of application No. 08/220,636, Mar. 31, 1994, Pat. No. 5,664,212, which is a continuation of application No. 08/074,288, Jun. 8, 1993, Pat. No. 5,305,463.

[51] Int. Cl.[7] .................................................... G06F 15/00

[52] U.S. Cl. ................................ 712/14; 712/11; 712/40; 708/232

[58] Field of Search ................................. 712/1, 14, 40, 712/11; 708/230, 232

[56] References Cited

U.S. PATENT DOCUMENTS

| | | | |
|---|---|---|---|
| 4,845,633 | 7/1989 | Furtek | 364/490 |
| 5,309,045 | 5/1994 | Saeki et al. | 307/465 |
| 5,551,017 | 8/1996 | Baxter | 395/550 |
| 5,649,176 | 7/1997 | Selvidge et al. | 395/551 |
| 5,717,832 | 2/1998 | Steimle et al. | 395/24 |

FOREIGN PATENT DOCUMENTS

| | | |
|---|---|---|
| 0 566 739 A1 | 10/1993 | European Pat. Off. . |
| 0 570 584 A1 | 11/1993 | European Pat. Off. . |
| 0 578 821 A1 | 1/1994 | European Pat. Off. . |
| WO 92/12498 | 7/1992 | WIPO . |
| WO 92/16971 | 10/1992 | WIPO . |
| WO 94/03929 | 2/1994 | WIPO . |

OTHER PUBLICATIONS

Stephen H. Unger, Asynchronous Sequential Switching Circuits, 1969, pp. 221–229.

Carver Mead & Lynn Conway, Introduction to VLSI Systems, 1980, pp. 242–262.

Ivan E. Sutherland, Micropipelines, *Communications of the ACM*, Dec. 1989, vol. 32, No. 6.

Wojcik et al.; On the Design of Three Valued Asynchronous Modules, *IEEE Transactions on Computers*, Oct. 1980, vol. C–29, No. 10, pp. 889–898.

Tadashi Shibata & Tadahiro Ohmi, A Functional MOS Transistor Featuring Gate–Level Weighted Sum and Threshold Operations, *IEEE Transactions On Electron Devices*, Dec. 1992, vol. 39, No. 6, pp. 1444–1455.

Anthony S. Wojcik & Kwang–Ya Fang, On The Design Of Three–Valued Asynchronous Modules, *IEEE Transactions On Computers*, Oct. 1980, vol. C–29, No. 10, pp. 889–898.

Mark Edward Dean, Strip: A Self–Timed Risc Processor, Jun. 1992.

Daniel Hampel & Robert Winder, Threshold Logic, *IEEE Spectrum*, May 1971, pp. 32–39.

(List continued on next page.)

*Primary Examiner*—John A. Follansbee
*Assistant Examiner*—Dzung C. Nguyen
*Attorney, Agent, or Firm*—Steptoe & Johnson LLP

[57] ABSTRACT

A NULL convention asynchronous register regulates wavefronts of signals through a NULL convention sequential circuit. The asynchronous register receives a control signal from a downstream circuit when the downstream circuit is ready to receive a new wavefront. Wavefronts alternate between meaningful data and NULL. The asynchronous register further generates a feedback signal to upstream circuits so that upstream circuits generate a wavefront when the sequential circuit is ready to receive the wavefront. Asynchronous registers can be used to create a variety of architectures, and to store data, as in a sequential circuit (state machine).

17 Claims, 11 Drawing Sheets

OTHER PUBLICATIONS

M.R. Greenstreet, T.E. Williams, and J. Staunstrup, Self-Timed Iteration, Elsevier Science Publishers B.V. (North-Holland), IFIP, 1988, pp. 309–322.

Teresa H.-Y. Meng, Robert W. Brodersen, and David G. Messerschmitt, Automatic Synthesis of Asynchronous Circuits from High–Level Specifications, IEEE Transactions on Computer–Aided Design, vol. 8, No. 11, Nov. 1989, pp. 1185–1205.

Ted Williams, Latency and Throughput Tradeoffs in Self-Timed Speed–Independent Pipelines and Rings, Stanford University Technical Report No. CSL–TR–91–482, May 1991.

Jens Sparso and Jorgen Staunstrup, Delay–insensitive multi-ring structures, Integration, the VLSI Journal 15, 1993, Elsevier Science Publishers B.V., pp. 313–340.

Tzyh–Yung Wuu and Sarma B.K. Vrudhula, A Design of a Fast and Area Efficient Multi–Input Muller C–element, IEEE Transactions on VLSI Systems, vol. 1, No. 2, Jun. 1993, pp. 215–219.

Marc Renaudin and Bachar El Hassan, The Design of Fast Asynchronous Adder Structures and Their Implementation Using D.C.V.S. Logic, Int'l. Symposium on Circuits & Systems, vol. 4, 1994, pp. 291–294.

Richard G. Burford, Xingche Fan and Neil W. Bergmann, An 180 Mhz 16 bit Multiplier Using Asynchronous Logic Design Techniques, IEEE 1994 Custom Integrated Circuits Conference, pp. 215–218.

Ted Williams, Self–Timed Rings and Their Application to Division, Stanford University Technical Report No. CSL–TR–91–482, May 1991.

Janusz A. Brzozowski & Carl–Johan H. Seger, Asynchronous Circuits—Monographs in Computer Science, Springer–Verlag New York, Inc., 1995, New York, NY.

ASYNCHRONOUS REGISTER

This application is a division of application Ser. No. 08/318,508, filed Oct. 5, 1994, now U.S. Pat. No. 5,652,902.

This is a continuation in part of U.S. patent application Ser. No. 08/220,636, filed Mar. 31, 1994, now U.S. Pat. No. 5,664,212 which is a continuation of U.S. application Ser. No. 08/074,288, filed Jun. 8, 1993, now U.S. Pat. No. 5,305,463.

BACKGROUND OF THE INVENTION

Previous logic systems, such as synchronous boolean logic systems, have employed clocking signals to regulate the sequential processing of binary logic signals. Typically, a combinational logic circuit will respond to multiple inputs to generate an output. As input logic signals propagate through the combinational circuit, the circuit output in unreliable for a period of time corresponding to set-up times and variations in propagation delays through the individual logic gates. Typically, the output signal is sampled at a time when the output is stable, often by latching the output into a register. The sampling is controlled by an independent clock signal, i.e., one that is not derived from the states of the logic gates themselves.

While these traditional synchronous circuits have become widely used, a substantial amount of design analysis is necessary to avoid a variety of timing-related problems, such as race conditions. Designers must build in timing margin to ensure that combination circuit outputs are stable, but this additional margin results in circuits operating at less than maximum speed. In addition, the fraction of power and wafer surface area that must be devoted to clocking circuitry is substantially, and in certain instances, may limit the total amount of circuitry that can be integrated onto a single chip.

SUMMARY OF THE PRESENT INVENTION

An object of the present invention is to avoid drawbacks of traditional synchronous logic systems.

A further object of the present invention is to enhance NULL convention logic circuits.

A further object of the invention is to provide a NULL convention asynchronous register.

A further object of the invention is to provide a simple NULL convention asynchronous register.

A further object of the invention is to provide simplified regulation of meaningful data and NULL wavefronts in NULL convention circuits.

A further object of the invention is to provide simplified "fan-in" architectures for NULL convention circuits.

A further object of the invention is to provide simplified "pipeline" architectures for NULL convention circuits.

A further object of the invention is to provide simplified "fan-out" architectures for NULL convention circuits.

A further object of the invention is to provide simplified, NULL convention, sequential circuits.

A further object of the invention is to provide NULL convention circuits with integrated asynchronous registers.

These and other objects are achieved by providing an asynchronous register having NULL convention gates and a monitor circuit. The asynchronous register receives a feedback signal from a downstream circuit that indicates either: 1) the downstream circuit is ready to receive a wavefront of meaningful data, or 2) the downstream circuit is ready to receive a NULL wavefront. When the downstream circuit indicates it is ready to receive meaningful data, the asynchronous register allows meaningful data to pass from its input to its output and signals an upstream circuit that the asynchronous register is ready to receive a NULL wavefront. When the downstream circuit indicates it is ready to receive NULL, the asynchronous register allows NULL to pass from its input to its output and signals an upstream circuit that the asynchronous register is ready to receive meaningful data.

The preferred embodiment of the asynchronous register uses NULL convention threshold gates as regulators to control data and NULL wavefronts. The threshold gates receive the feedback signal from the downstream circuit as an input. When the downstream circuit is ready to receive NULL, the feedback signal goes NULL. When the feedback signal is NULL and when the input signals are NULL, the threshold gates switch their outputs to NULL. When the downstream circuit is ready to receive meaningful data, the feedback signal is asserted. When the feedback signal is asserted and the input signals are asserted, the threshold gates assert their outputs.

The asynchronous register also uses a monitor circuit (DACK/NACK monitor) to monitor the outputs of the regulating gates. The DACK/NACK monitor output becomes a feedback signal to an upstream circuit. When all of the outputs of the regulating gates are NULL, the DACK/NACK monitor asserts its feedback signal, which can be used by an upstream circuit to present meaningful data to the asynchronous register. When a number of regulating gates assert their outputs, the DACK/NACK monitor switches its feedback signal to NULL, which in turn can be used by an upstream circuit to present NULL. The number of regulating gates needed to trigger the DACK/NACK monitor is the number of mutually exclusive assertion groups having inputs to the asynchronous register. A mutually exclusive assertion group is a group of signal lines having a characteristic that only one line of the group may be asserted at a time.

Asynchronous registers may be placed at the input to a combinational circuit. Combinational circuits (each with an asynchronous register) may then be arranged in a variety of architectures, including "pipeline," "fan-in" and "fan-out." Regulating gates of an asynchronous register may be combined with gates of a combinational circuit in order to reduce gate count and/or reduce interconnect-line count. Asynchronous registers may also be used to store data, such as the state of a sequential circuit (state machine).

BRIEF DESCRIPTION OF THE DRAWINGS

The invention will be described below with reference to attached drawings in which.

DETAILED DESCRIPTION OF THE PREFERRED EMBODIMENTS

The scope of the invention is defined by claims at the conclusion of the description of the preferred embodiments. However, the organization, operation, advantages and objects of the invention can be more fully appreciated from the following description.

A NULL convention combinational circuit generates a result value set in response to an input value set. An important aspect of NULL convention circuits is that any particular input may have a meaningful value or a NULL value which has no meaning. The very presence of a non-NULL value indicates that the value has meaning, and no external clock is required to indicate that a value is meaningful. Further information regarding NULL convention logic can be found in U.S. Pat. No. 5,305,463, which is incorporated here by reference. Certain aspects are reiterated here for convenience.

NULL convention differs from traditional boolean logic where each signal line may have one of two meaningful states. In traditional logic that uses CMOS or TTL implementation, a low voltage level on a signal line means "logic false" or the number "zero." A high voltage level on the same line means "logic true" or the number "one." Thus a signal line may assume one of two values, either of which may or may not be meaningful.

NULL convention has multiple implementations which include a NULL state which has no meaning. In one implementation, two. separate signal lines would be used in order to convey two meaningful values. For example, logic "false" would be conveyed by asserting a high voltage on the first line and a low voltage on the second line. Logic "true" would be conveyed by asserting a low voltage on the first line and a high voltage on the second line. NULL would be conveyed by low voltage levels on both lines. (High voltage levels on both lines is unused.) In this example, meaning is expressed according to the signal line asserted, not by the choice of voltage level. A high voltage level "asserts" the meaning of the line. A low voltage level is meaningless.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the zero voltage level is NULL (meaningless). In other implementations, parameters other than voltage may be used as long as the requisite number of states can be differentiated. Discussions here will assume an implementation in which each signal line may assume two voltage levels, with a high level asserting meaning and the ground voltage level being NULL. This provides voltage levels as concrete examples to aid in explanation, but the invention is not limited to these voltage-level examples.

Figure 1:
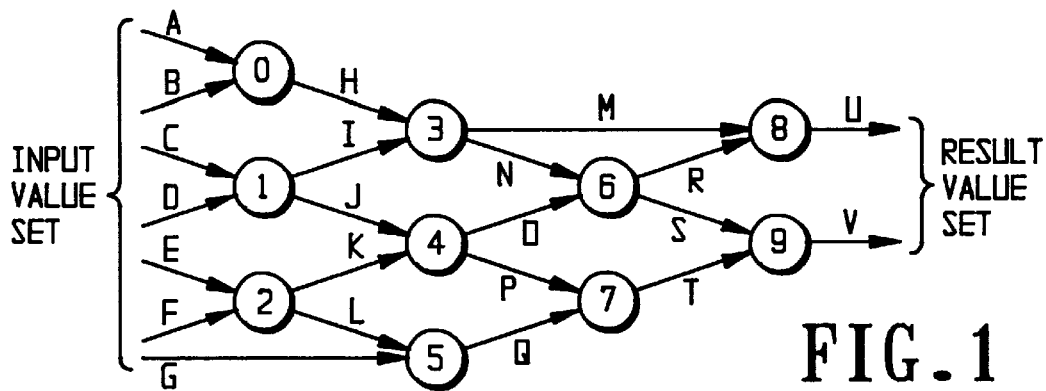
FIG. 1 illustrates a NULL convention combinational circuit.

Another important aspect of NULL convention circuits is the way that meaningful and NULL signals propagate through a combinational circuit. All inputs to a NULL convention logic element must be meaningful before the element asserts a meaningful output. FIG. 1 illustrates a NULL convention combinational circuit. In FIG. 1, logic gates are shown as circles and labeled with numerals 0–9. Input lines are labeled with letters A–G, output lines are labeled with letters U,V, and internal connection lines are labeled with letters H–T. Signal lines are schematic, and may be individual conductors, multiple conductors or another NULL convention configuration.

In a NULL convention circuit, a logic gate transitions from a NULL to a meaningful output value after all inputs have assumed meaningful values. For example, as illustrated in FIG. 1, assume that input lines A and B initially have NULL values, and logic gate zero (0) initially has a NULL output. In the case that only input line A transitions to a meaningful value (while input line B remains at NULL), logic gate zero will maintain a NULL output value. In the case that only input line B transitions to a meaningful value (while input line A remains at NULL), logic gate zero still will maintain a NULL output. When both input lines A and B transition to meaningful values (either simultaneously or sequentially), then logic gate zero (0) will change its output to a meaningful value.

The characteristic described above applies to all logic gates in the sequential circuit. Logic gates zero through two, which are directly connected to input lines, will provide meaningful values to the next level of gates (three through five) only when the respective inputs have completely assumed meaningful values. This produces a general result that can be visualized as a wavefront of meaningful values propagating through the network. At the network output, logic gates eight and nine will change their individual outputs from NULL to meaningful values only when all upstream gates have propagated meaningful values.

Two important characteristics should now be apparent. First, the network outputs transition from NULL to meaningful values cleanly. That is, the outputs do not switch back and forth while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, complete, and may be used by downstream circuitry. Thus, no external clock is required to indicate that the network has completed its operations.

The NULL convention logic gates discussed here also exhibit a second characteristic; their outputs transition from a meaningful value to NULL only when all inputs have switched to NULL. In this way, NULL values propagate through the network cleanly, and the very presence of NULL values at the output is sufficient to indicate that all gates in the network have returned to NULL output states.

Figure 2:
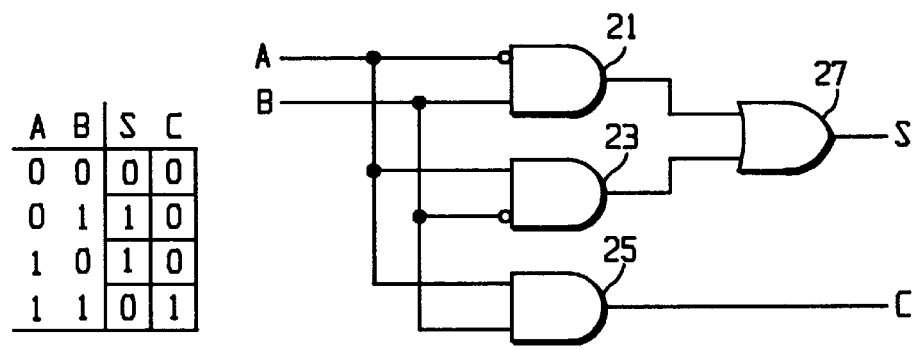
FIG. 2 illustrates a Boolean half-adder constructed of three AND gates and an OR gate.

FIG. 2 illustrates a Boolean half-adder constructed of three AND gates 21, 23, 25 and an OR gate 27. The half adder has two input signal lines A and B, and two output line S (sum) and C (carry). Each input line may assume one of two meaningful values: "zero" and "one." Each output line may assume one of two meaningful values: "zero" and "one." The half adder implements a transfer function such that:

i) when both inputs are zero, sum (S) and carry (C) outputs are "zero;"

ii) when a single input is "one" (and the other is "zero"), sum is "one" and carry is "zero;"

iii) when both inputs are "one," sum is "zero" and carry is "one."

Figure 3:
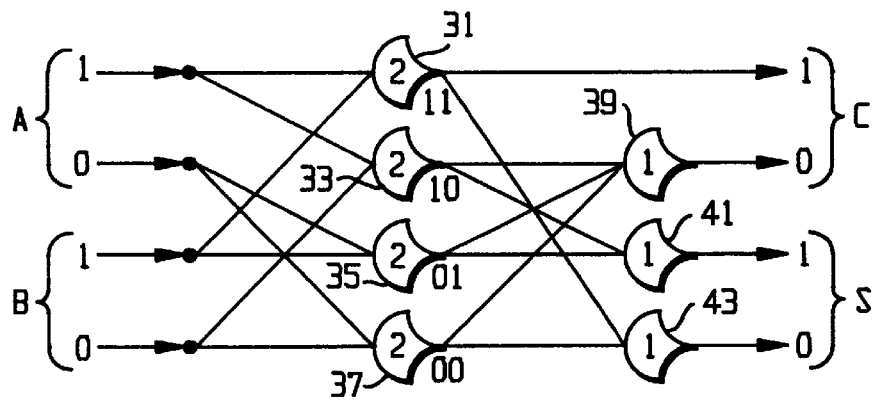
FIG. 3 illustrates a "two-wire" NULL convention half adder.

For comparison, FIG. 3 illustrates a "two-wire" NULL convention half adder. It is similar to the boolean half-adder of FIG. 2 in that there are two inputs A and B and two outputs S and C, and it implements the same transfer function. Unlike the Boolean circuit, the NULL convention half-adder has a separate signal line for each meaning. The carry output, for example, has two separate signal lines, each of which may assume one of two voltage levels. A first voltage level is meaningful and the other voltage level is NULL. In order to assert a meaning of "carry equals zero," the first signal line (designated as having a meaning "zero" when asserted) is driven to its meaningful voltage level, while the second signal line is held at the NULL voltage level. In order to assert a value "carry equals one," the first signal line is held at the NULL voltage level, while the second signal line (designated by design as having a meaning "one") is driven to the meaningful voltage level. The half-adder can also assert "carry has no meaning" by holding both carry signal lines at NULL. It is not permitted to have both carry lines at the meaningful voltage level. Similarly, the remaining inputs and outputs (A, B, S) each have a pair of signal lines. Each pair of lines is a mutually exclusive assertion group, because only one line of any group will be asserted at a time.

Hereafter, when a NULL convention circuit switches a signal line to a meaningful value, it will be said that the circuit "asserts" the line, or that the line is "asserted." When a NULL convention circuit switches a signal line to a NULL value, the line will be said to be NULL.

The two carry lines form a group in which at most one line may be asserted (i.e., assume a meaningful value). Such a group is referred to has a "mutually exclusive assertion group." In other design situations, mutually exclusive assertion groups may have more than two lines. A single line, by itself, can be considered a mutually exclusive assertion group.

Internally, the NULL convention half adder is made of six threshold gates 31, 33, 35, 37, 39, 41, 43. Each threshold gate has a single signal line output which may be asserted (assume a meaningful voltage level) or NULL (assume a NULL voltage level). The signal line may fan out to several destinations. Four of the gates 31, 33, 35, 37 have two input signal lines and a threshold of two ("threshold-two gate"). The output of a threshold-two gate is asserted when two (both) of the input lines are asserted. One of the gates 39 has three input signal lines and threshold of one ("threshold-one gate"). The output of the threshold-one gate is asserted when any one of the three inputs is asserted. Two of the gates 41, 43 have two inputs and a threshold of one. As a drawing convention, a numeral inside a threshold gate symbol indicates the number of asserted input lines needed to cause the gate to assert its output.

Each of the NULL convention gates of the half adder exhibits the characteristic that it switches to a meaningful value only when the requisite number of inputs becomes meaningful, and each threshold gate holds a meaningful output value until all of the inputs become NULL. Thus, threshold gates exhibit a hysteresis: as the number of inputs drops below the threshold, the output remains meaningful. For example, the threshold-two gates 31, 33, 35, 37 will maintain meaningful output levels when the number of meaningful inputs drops from two to one. The threshold-two gates will switch to NULL when all inputs become NULL.

For certain design situations, it is desirable to control the presentation of data to a combinational NULL convention circuit. As discussed more fully below, this can be accomplished with an asynchronous register.

Figure 4:
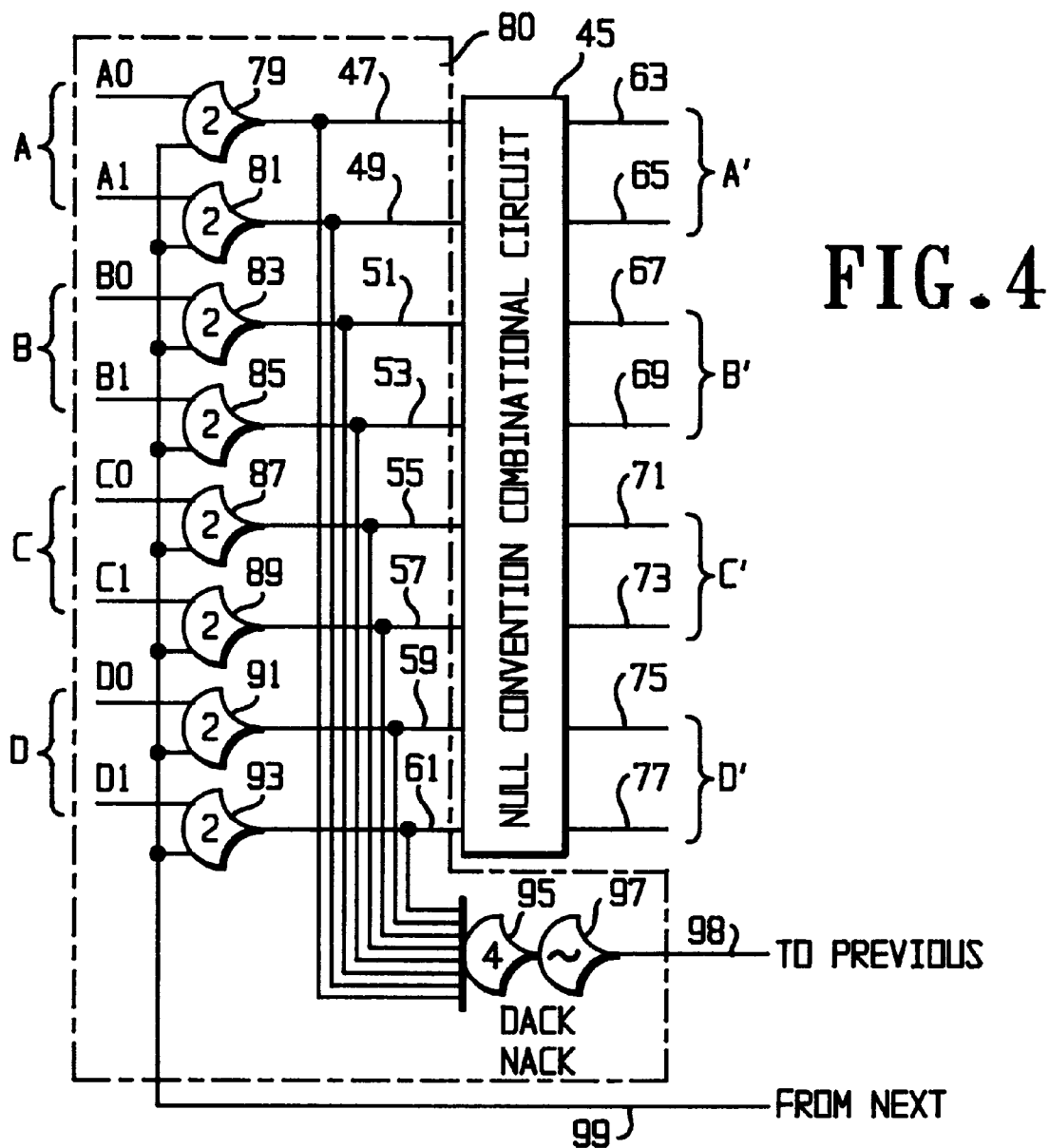
FIG. 4 illustrates a NULL convention combinational circuit with asynchronous register.

FIG. 4 illustrates a NULL convention combinational circuits with asynchronous register. The combinational circuit 45 is shown with eight input lines 47, 49, 51, 53, 55, 57, 59, 61 and eight output lines 63, 65, 67, 69, 71, 73, 75, 77. This is intended to illustrate a generalized circuit, the specific transfer function of which is not important here.

FIG. 4 also shows an asynchronous register 80, which is made up of eight, threshold-two gates 79, 81, 83, 85, 87, 89, 91, 93, a gate with a threshold of four ("threshold-four gate") 95 and an inverting gate 97. The threshold-four gate and the inverting gate will be referred to as a "DACK/NACK monitor" (data acknowledge/NULL acknowledge).

The inputs to the asynchronous register 80 are divided into four mutually exclusive assertion groups, A, B, C and D. The outputs of the combinational circuit 45 are also divided into four mutually exclusive assertion groups, A', B', C' and D'. This division of input and output lines is shown as an example. The number of mutually exclusive assertion groups, and the number of lines per group may vary freely according to the needs of the circuit. The threshold the DACK/NACK monitor will be the number of mutually exclusive assertion groups.

The asynchronous register 80 serves to regulate the presentation of NULL and meaningful wavefronts to the NULL convention combinational circuit 45. When the inputs to the asynchronous register are all NULL, the outputs of the eight threshold-two gates are NULL, and the output of the threshold-four gate 95 is NULL. The output of the inverting gate 97, and thus the output of the DACK/NACK monitor is asserted. The DACK/NACK monitor asserts the "to previous" signal line 98, and an upstream circuit (not shown) presents meaningful data to the input lines of the asynchronous register 80. A downstream circuit (not shown) signals that it is ready to accept data from the combinational circuit 45 by asserting the "from next" signal line 99.

The asserted "from next" line 99 provides a common asserted signal to the threshold-two gates 79, 81, 83, 85, 87, 89, 91, 93. When any input data line A0, A1, B0, B1, C0, C1, D0, D1 is asserted, the respective threshold-two gate is asserted, and the input data passes through the asynchronous register 80 to the combinational circuit 45.

For example, if inputs A0 and A1 form a mutually exclusive assertion group and line A0 is asserted, a first threshold-two gate 79 receives two asserted inputs (one from the "from next" line, and another from the A0 signal line) and asserts its output line 47. By contrast, a second threshold-two gate 81 will not assert its output line 49, because it receive only one asserted input (from the "from next" line). The combinational circuit 45 will process the inputs received from the asynchronous register 80, and meaningful values will be presented to a downstream circuit (not shown).

When the downstream circuit has received the meaningful values, it switches the "from next" signal line to NULL. The asynchronous register 80 acts as a storage element due to the hysteresis of the individual threshold-two gates. Even though the "from next" signal line is NULL, the threshold-two gates continue to assert meaningful data (or NULL) as before.

If the eight input lines 79, 81, 83, 85, 87, 89, 91, 93 are made up of four mutually exclusive assertion groups, then four of the threshold-two gates will be asserted. The threshold-four gate 95 will assert its output, which causes the inverter 97 to switch the "to previous" line to NULL. In response, the upstream circuit (not shown) presents NULL on all lines to the inputs of the asynchronous register 80. The asynchronous register threshold-two gates receive NULL from the upstream circuit and NULL from the "from next" signal line, and all the threshold-two gates switch their outputs to NULL. The NULL wavefront passes through the combinational circuit 45, and one complete data cycle is complete. The cycle can be repeated, with alternating wavefronts of NULL and meaningful data passing through the asynchronous register 80 and combinational circuit 45.

Figure 5:
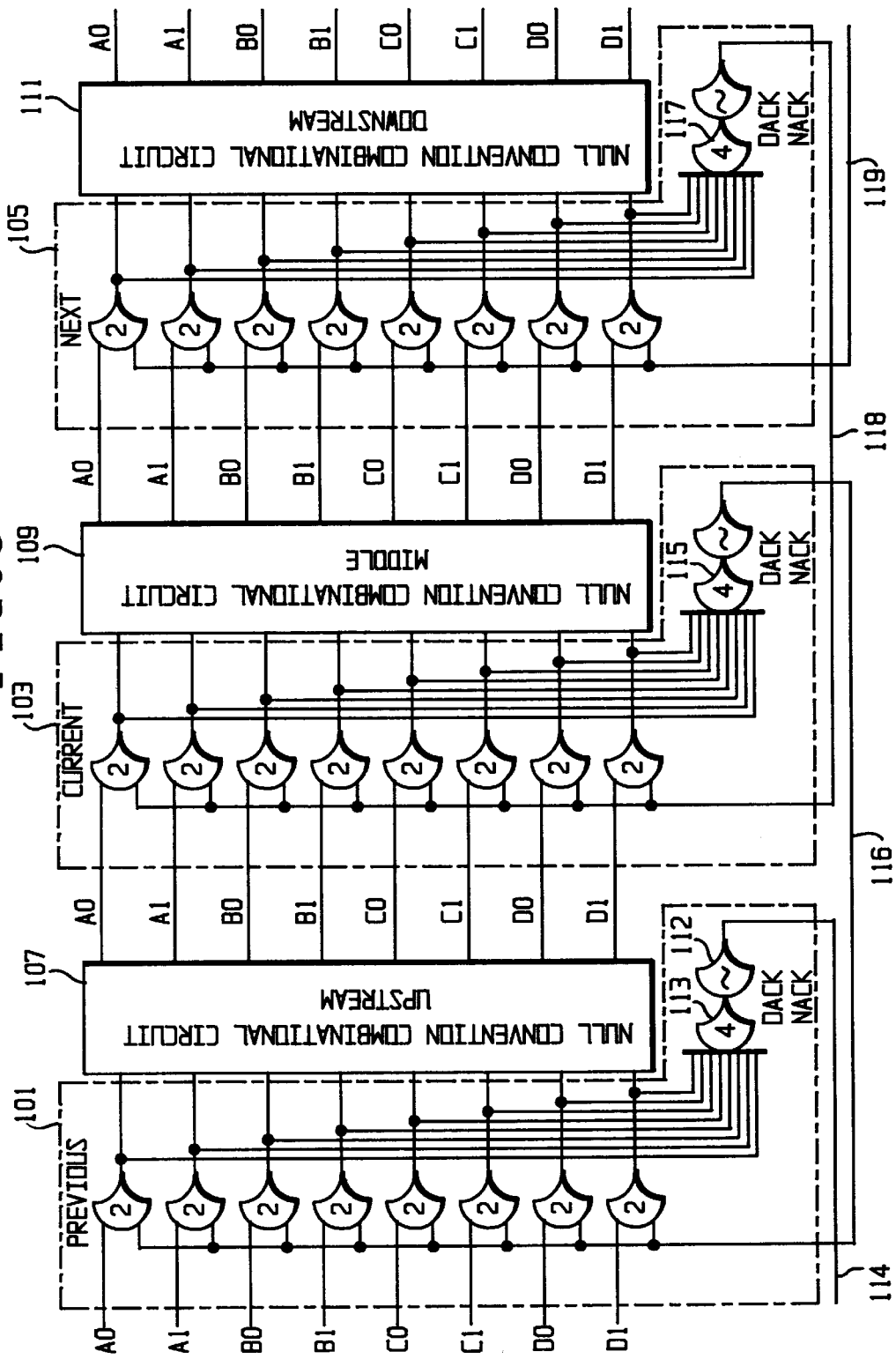
FIG. 5 illustrates use of asynchronous registers in a pipeline architecture of NULL convention combinational circuits.

It should be appreciated that combinational circuit can be arranged in a variety of architectures, including "pipeline," "fan-in" and "fan-out" with appropriate use of asynchronous registers. FIG. 5 illustrates three combinational circuits 107, 109, 111 and three asynchronous registers 101, 103, 105 in a pipeline architecture. The central asynchronous register 103 is designated as "current." The upstream asynchronous register 101 is designated as "previous," and the downstream asynchronous register 105 is designates as "next." The NULL convention circuit 107 receiving data from the "previous" asynchronous register will be referred to as the "upstream" circuit. The NULL convention circuit 191 receiving data from the "current" asynchronous register will be referred to as the "middle" circuit. The NULL convention circuit 111 receiving data from the "next" asynchronous register will be referred to as the "downstream" circuit.

A feedback line 118 connects the "next" asynchronous register 105 to threshold-two gates of the "current" register 103. A feedback line 116 connects the "current" asynchronous register 105 to threshold-two gates of the "previous" register 103. A feedback line 114 connects the "previous" asynchronous register 105 to an input circuit (not shown). A feedback line 119 connects the "next" asynchronous register 105 to yet a further downstream circuit (not shown).

When all inputs to the asynchronous registers 101, 103, 105 are NULL, the outputs from the asynchronous registers (and thus the inputs to the circuits 107, 109, 111) are all NULL, and the outputs from the circuits 107, 109 111 are NULL. All feedback lines 114, 116, 118, 119 are asserted, indicating that the registers are ready to accept data.

In response to the asserted feedback line 114 from the previous asynchronous register 101, input circuitry (not shown) presents meaningful data to the previous asynchronous register 101. A wavefront of meaningful data passes through the previous asynchronous register 101 to the upstream circuit 107. The threshold-four gate 113 of the previous asynchronous register 101 now receives four asserted inputs and asserts its output. Due to the inverter 112, the feedback line 114 becomes NULL. (Again, it is assumed that inputs to the previous asynchronous register form four mutually exclusive assertion groups.)

The wavefront of meaningful data passes through the upstream combinational circuit 107 and is presented to the "current" asynchronous register 103. Threshold-two gates of the "current" asynchronous register 103 that receive asserted signals will, in turn, assert their output signal lines.

The threshold-four gate 115 of the "current" asynchronous register 101 now receives four asserted inputs, and the "current" asynchronous register switches the feedback line 116 to NULL. (Again, the number of mutually exclusive assertion groups passing between the upstream combinational circuit 107 and current asynchronous register 103 may vary, and the threshold of the current asynchronous register 103 will be the number of mutually exclusive assertion groups.) The threshold-two gates of the "previous" asynchronous register continue to present meaningful data due to the hysteresis characteristic.

The wavefront of meaningful data passes through the middle circuit and is presented to the "next" asynchronous register 105. Threshold-two gates of the "next" asynchronous register 105 that receive asserted signals will, in turn, assert their output signal lines. The "next" asynchronous register 105 switches its feedback line 118 to NULL, but the "current" asynchronous register continues to hold meaningful data due to hysteresis. (Again, the threshold of the DACK/NACK monitor 117 will be set to the number of mutually exclusive assertion groups input to the next asynchronous register 105.)

A NULL wavefront propagates through the pipeline in a similar manner to the meaningful data wavefront. When the "previous" asynchronous register 101 switched its feedback line to NULL, the input circuit (not shown) switched its data lines to NULL. When NULL values are presented to the "previous" asynchronous register 101 (and when the "current" asynchronous register 103 has received meaningful data and switched its feedback line 116 to NULL), the threshold-two gates of the "previous" asynchronous register 101 switch their outputs to NULL. The "previous" asynchronous register 101 asserts its feedback line, and thus has returned to its starting state (ready to accept new data).

The NULL wavefront passes through the upstream circuit 107, and all NULL signals are presented to the "current" asynchronous register 103. When the NULL wavefront arrives at the inputs to the "current" asynchronous register 103, the threshold-two gates switch their outputs to NULL, and the feedback line 116 is asserted. The "current" asynchronous register 103 thus completes its cycle.

The NULL wavefront passes through the middle circuit 109 to the "next" asynchronous register. When the NULL wavefront arrives at the inputs to the "next" asynchronous register 105, the "next" asynchronous register presents NULL to the upstream circuit 111 and asserts its feedback line 118. The "current" asynchronous register thus completes its cycle. The NULL wavefront passes through the upstream circuit 111, and the pipeline has complete one cycle.

It should be appreciated that a downstream asynchronous register signal of the pipeline uses the feedback line to signal an upstream asynchronous register that the downstream asynchronous register is ready to accept either data or a NULL wavefront. Each asynchronous register regulates its feedback line based upon the local state of its threshold gates. Thus, as soon as a register has accepted data, it immediately signals an upstream register to propagate a NULL wavefront. As soon as a register has accepted NULL, it signals an upstream register to propagate new data. Because of the hysteresis characteristic, data lines and feedback lines of asynchronous registers switch only when NULL and data wavefronts have been completely processed. Signal lines always present either meaningful data or NULL, and there is no need for registers to wait for an external clock to signal them to latch data. The very fact that meaningful data has arrived indicates that the data is valid. The circuits are self-timing.

It should also be appreciated that NULL and meaningful data wavefronts may pass closely behind one another. For example, while a NULL wavefront is passing through the middle combinational circuit 109, a meaningful data wavefront may be passing through the upstream combinational circuit 107. Furthermore, meaningful data wavefronts cannot overtake one another. Each asynchronous register must process alternating wavefronts of meaningful data and NULL.

Figure 6:
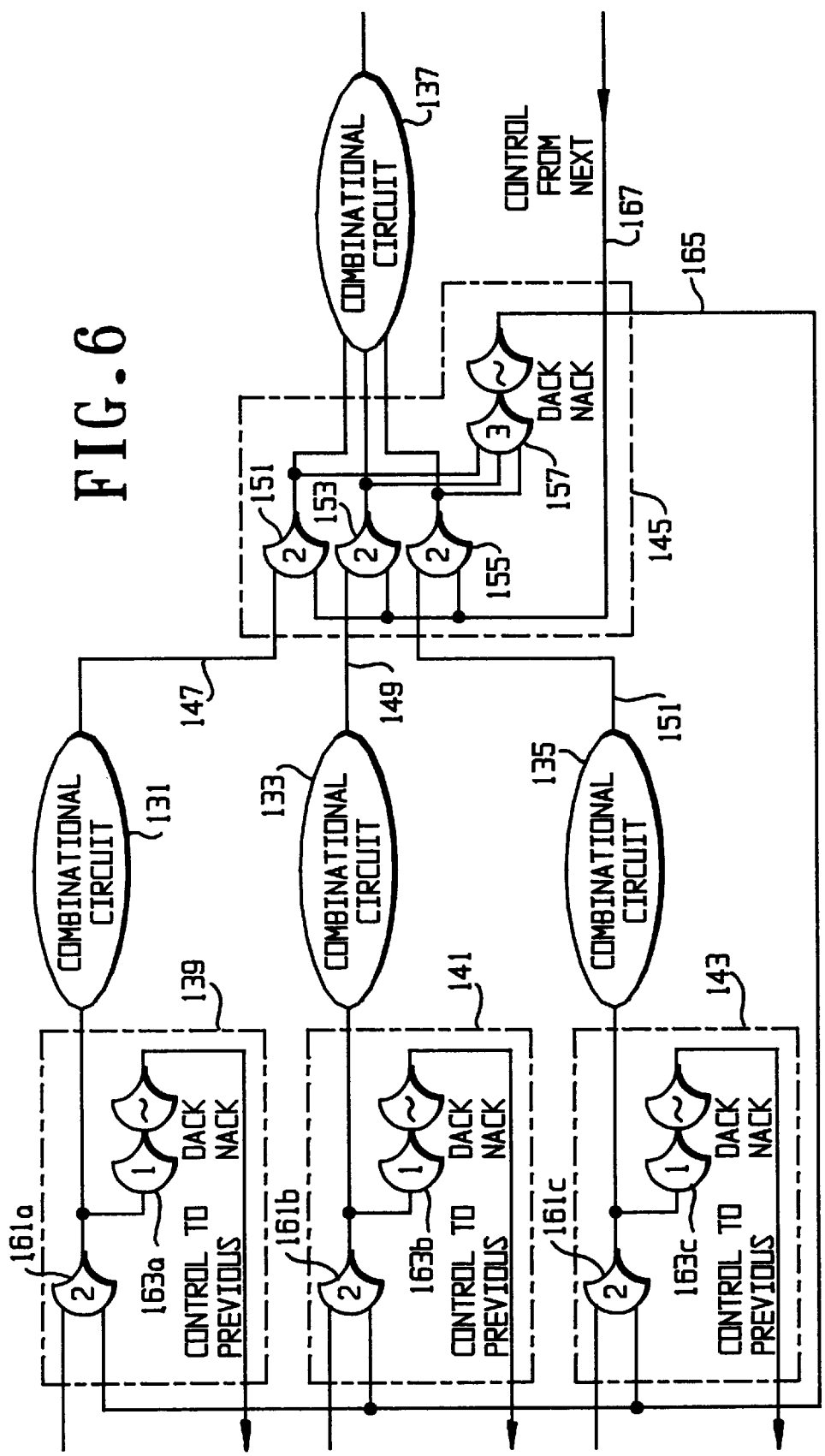
FIG. 6 illustrates use of asynchronous registers in a fan-in configuration of NULL convention combinational circuits.

FIG. 6 illustrates use of asynchronous registers in a fan-in configuration of NULL convention combinational circuits. The architecture includes four combinational circuits 131, 133, 135, 137 and four asynchronous registers 139, 141, 143, 145. Three of the combinational circuits 131, 133, 135 (referred to here as the "upstream" circuits) feed into the fourth combinational circuit 137. Each of the upstream circuits 131, 133, 135 is shown schematically with a single connection line 147, 149, 151. It should be understood that each connection line may be one or a higher number of individual signal lines forming one or a number of mutually exclusive assertion groups. Each connection line will be discussed here as if each is a single mutually exclusive assertion group. In each group, one line will be asserted when presenting meaningful data, and all lines will be NULL otherwise. Thus, when meaningful data is presented, each connection line can be viewed as being asserted.

The downstream asynchronous register 145 includes three threshold-two gates 151, 153, 155 and a DACK/NACK monitor 157. One threshold-two gate receives an input from a single upstream combinational circuit. The DACK/NACK monitor has a threshold-three gate and an inverter.

Each upstream asynchronous register includes a single threshold-two gate 161a, 161b, 161c and a threshold-one DACK/NACK monitor 163a, 163b, 163c. A feedback line 165 from the downstream asynchronous register 145 fans out to each of the upstream asynchronous registers 139, 141, 143.

The asynchronous registers serve to regulate presentation of data and NULL wavefronts to the combinational circuits. Each of the upstream asynchronous registers 139, 141, 143 receives data and NULL wavefronts from input circuitry (not shown). When wavefronts of meaningful data pass through all upstream combinational circuits, 131, 133, 135, and when an output circuit (not shown) asserts the "control from next" feedback signal line 167, the downstream asynchronous register 145 passes the data to the downstream combinational circuit 137. After the downstream asynchronous register 145 has propagated all three input signals, the downstream asynchronous register 145 returns the feedback signal line 145 to NULL. A NULL wavefront then passes through the upstream combinational circuits in a similar manner. The single, fanned-out feedback line 145 controls the presentation of wavefronts to the upstream circuits 131, 133, 135. The upstream circuits 131, 133, 135 will not be enabled to propagate a new wavefront until all signals from a prior wavefront have passed through to the downstream asynchronous register 151.

Figure 7:
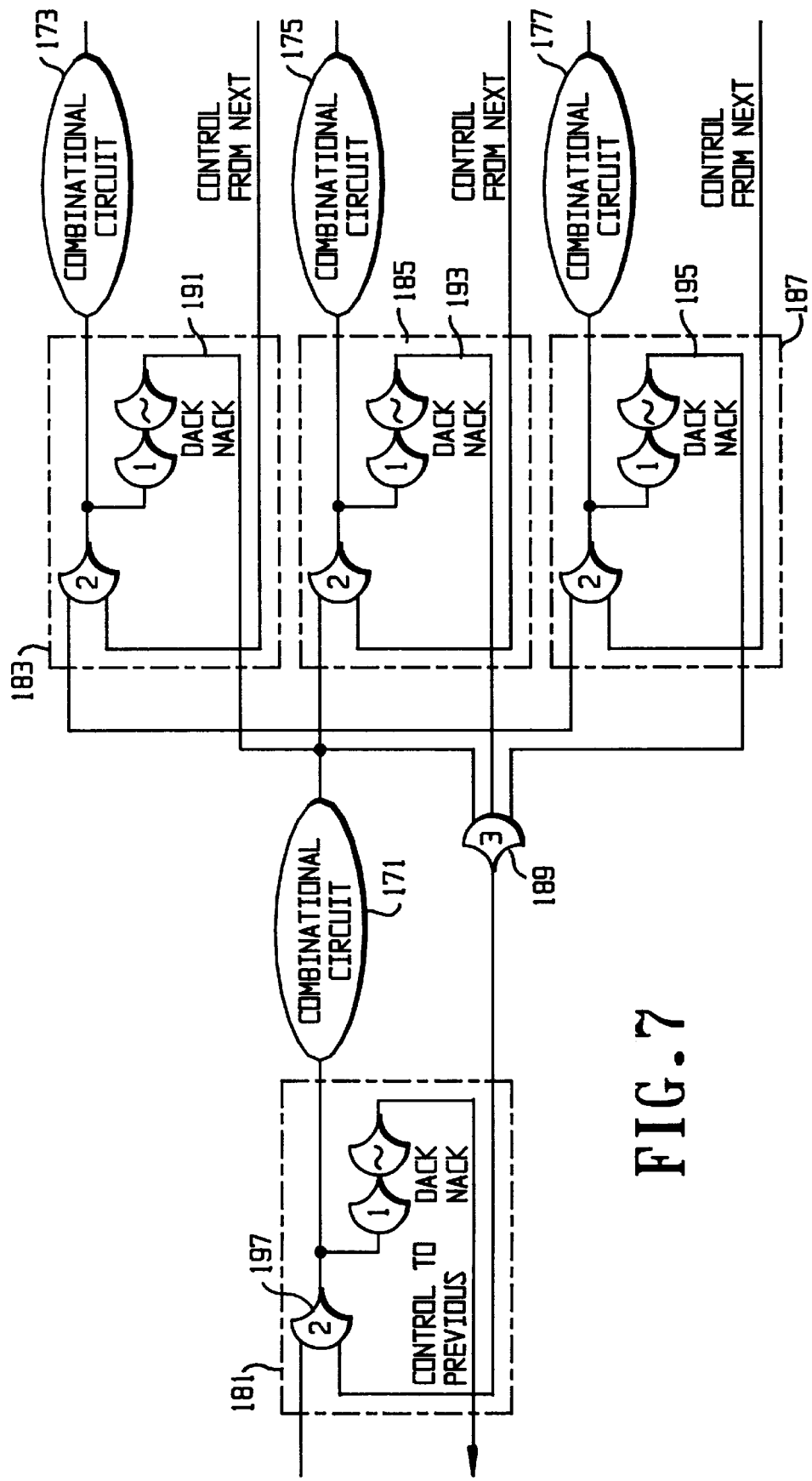
FIG. 7 illustrates use of asynchronous registers in a fan-out configuration of NULL convention combinational circuits.

FIG. 7 illustrates use of asynchronous registers in a fan-out configuration of NULL convention combinational circuits. The architecture includes one upstream combinational circuits 171 and three downstream combinational circuits 173, 175, 177. There is one upstream asynchronous register 181 and three downstream asynchronous registers 183, 185, 187. The drawing conventions of FIG. 7 are the same as the drawing conventions of FIG. 6.

The architecture further includes a threshold-three gate 189, which may be considered as either a part of the upstream asynchronous register 181 or separate. The threshold-three gate 189 receives three feedback lines 191, 193, 195 from the downstream asynchronous registers 183, 185, 187. Alternately, the threshold-three gate 189 may be merged with the threshold-two gate 197 of the upstream asynchronous register 181 to form a threshold-four gate.

The asynchronous registers serve to regulate presentation of data and NULL wavefronts to the combinational circuits. Each of the three downstream asynchronous registers 183, 185, 187 is regulated by "control from next" signals from output circuitry (not shown). The upstream asynchronous register 197 will propagate a new wavefront only when enabled by the threshold-three date, i.e., when all three downstream asynchronous registers 183, 185, 187 have signaled readiness on their respective feedback lines.

Examples discussed above have used combinational circuits as examples. In such circuits the outputs are determined directly from the inputs. Asynchronous circuits can also be used in a NULL convention sequential circuit (sometimes referred to as a state machine).

Figure 8:
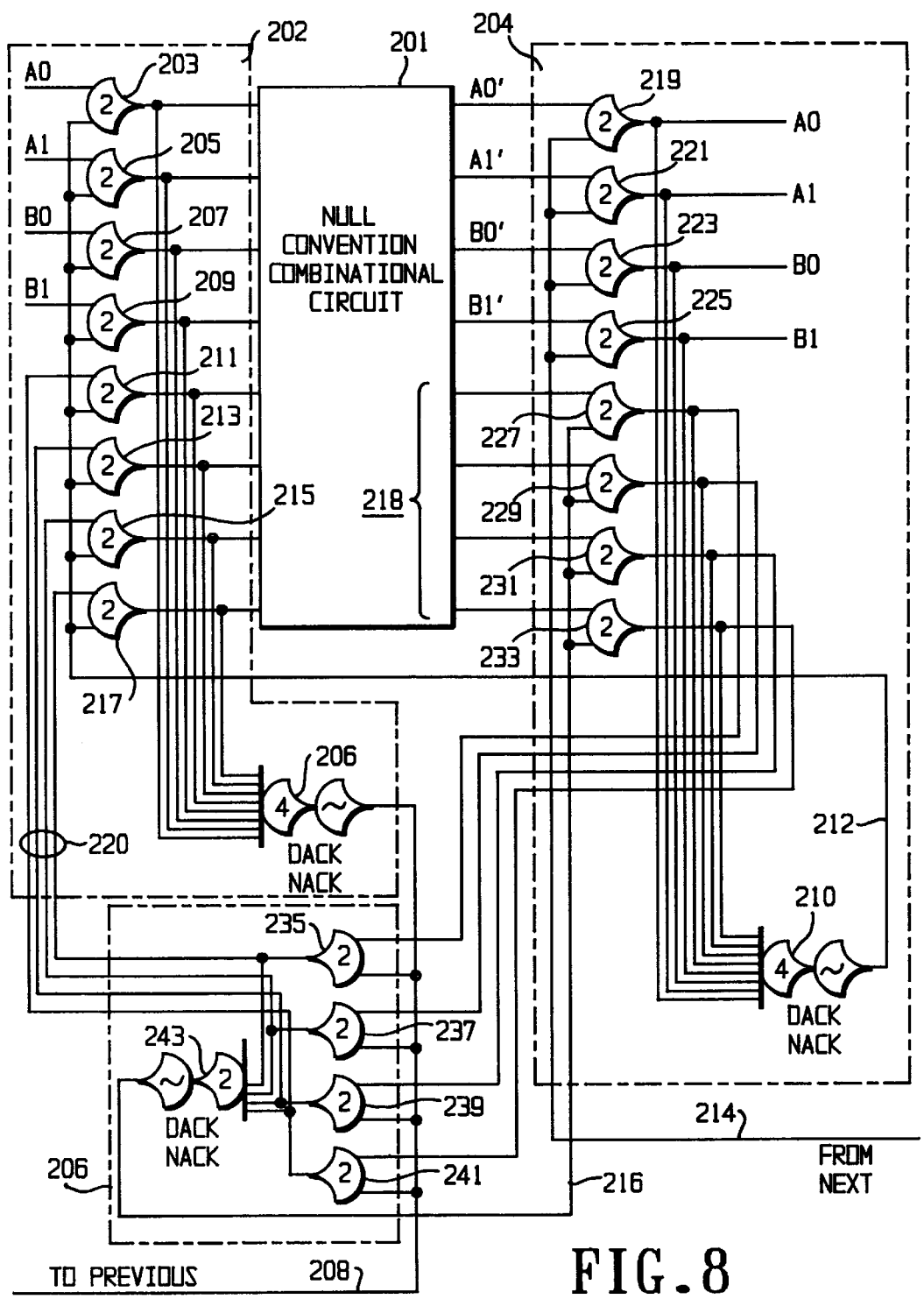
FIG. 8 illustrates a NULL convention sequential circuit.

FIG. 8 illustrates a NULL convention sequential circuit. Individual connection lines are schematic, with each capable of being asserted or being NULL. The sequential circuit includes a NULL convention combinational circuit 201, as well three asynchronous registers: an input asynchronous register 202, an output asynchronous register 204, and a state-feedback asynchronous register 206.

The input asynchronous register 202 includes eight, threshold-two gates 203, 205, 207, 209, 211, 213, 215, 217. The upper four of the input gates in the drawing 203, 205, 207, 209 receive inputs A0, A1, B0, B1 from an external source (not shown). These four input form two mutually exclusive assertion groups. The lower four of the input gates 211, 213, 215, 217 receive state information from four state feedback lines 220 from the feedback asynchronous register 206. The four state-feedback signal lines form two mutually exclusive assertion groups.

The input asynchronous register also includes a threshold-four DACK/NACK monitor 206 which produces a feedback signal 208. The feedback signal 208 connects to an upstream data source (which provides four of the eight inputs), as well as to the feedback asynchronous register 206 (which provides the other four of eight inputs).

The output asynchronous register 204 includes eight, threshold-two gates 219, 221, 223, 225, 227, 229, 231, 233. The upper four of the input gates in the drawing 219, 221, 223, 225 receive data outputs from the combinational circuit 201, and the lower four receive signals for changing the state of the circuit. The eight outputs form four mutually exclusive assertion groups. The output asynchronous register also includes a threshold-four DACK/NACK monitor 210 which provides a feedback signal 212 to the input asynchronous register. A downstream circuit (not shown) provides a "from next" signal 214 to indicate that the downstream circuit is ready to receive data, or NULL. The "from next" signal 214 provides an input to the upper four, threshold-two gates 219, 221, 223, 225. The lower four, threshold-two gates receive a feedback signal 216 from the state-feedback asynchronous register 206.

The state-feedback asynchronous register 206 includes four, threshold-two gates 235, 237, 239, 241 and a threshold-two DACK/NACK monitor 243. The threshold-two gates 235, 237, 239, 241 store the state of the circuit. The DACK/NACK monitor 243 generates a feedback signal for the lower registers 227, 229, 231, 233 of the output register 204.

The sequential circuit operates as a state machine. The states are stored in the threshold-two gates of the feedback asynchronous register 206. During one data cycle, the upstream source (not shown) provides data to the combinational circuit 201 on input data lines A0, A1, B0, B1. The feedback asynchronous register 206 provides state information on state-feedback lines 220. Based on the present state and the input data, the combinational circuit 201 generates output data on output data lines A0', A1', B0', B1', and selectively transitions to a new state. State control data lines 218 from the combinational circuit 201 cause the threshold-two gates of the feedback asynchronous register 206 to switch to the new state.

The DACK/NACK monitors 206, 210, 243 regulate the propagation of NULL and data wavefronts. Conceptually, the threshold-two gates of the input and output asynchronous registers can be partitioned into upper and lower halves. Upper halves handle data signals, lower halves handle state-feedback signals. Upper halves operate in an analogous manner to the pipeline architecture described above in relation to FIG. 5.

The threshold-two gates 235, 237, 239, 241 of the state-feedback asynchronous register receive data-like inputs from the output asynchronous register 204, and a timing-like input from the DACK/NACK monitor 206 of the input asynchronous register. Thus, the threshold two gates 235, 237, 239, 241 of the feedback register will transition when: 1) the combinational circuit has completed a cycle and 2) the input register is ready to begin a new cycle. An example of the sequence of events is as follows, based on an initial state in which all data inputs are NULL, all data outputs are NULL, the state is an initial state DACK/NACK monitor lines 208, 212 are asserted, and DACK/NACK signal line 216 is NULL.

1) Meaningful input data arrives at the input asynchronous register 202 from an upstream source circuit.

2) Meaningful input data propagate through input register 202, because DACK/NACK signal from output register 204 is asserted. State information from feedback register 206 also propagates with meaningful data. The input register DACK/NACK signal line 208 goes to NULL. At this time, the state-feedback register threshold-two gates switch to NULL (because the feedback line 208 is now NULL) and feedback line 216 is asserted.

3) Combinational circuit 204 generates meaningful output data and new state data.

4) Meaningful output data and new state data propagate through the output register 204 (feedback lines 216 and 214 are now asserted). The output register DACK/NACK signal line 212 goes to NULL. Meaningful data also propagates onward to a downstream circuit (not shown), which switches its "from next" signal line 214 to NULL.

5) New state data is presented to the input of feedback asynchronous register 206. The threshold-two gates 235, 237, 239, 241 do not transition at this time, because the DACK/NACK signal from the input asynchronous register 202 switched to NULL in step 2. The feedback register DACK/NACK monitor output signal 216 remains asserted. As will be seen below, the lower gates 227, 229, 231, 233 of the output asynchronous register 204 will hold the state data until stored in the feedback register 206 at a later time.

6) A NULL wavefront arrives at the input register 202 from the source. (The transition of input register DACK/NACK signal line in step 2 triggers the presentation of the NULL wavefront.)

7) The NULL wavefront propagates through the input register 202, because the output register DACK/NACK signal line 212 went to NULL in step 4. Now, the input register DACK/NACK signal 208 is asserted, and the feedback register threshold-two gates 235, 237, 239, 241 transition in accordance with the state control signals 218. The feedback register DACK/NACK signal line 216 goes to NULL.

8) The NULL wavefront propagates through the combinational circuit 201, and NULL appears on both the output data lines A0', A1', B0', B1' and on the State control data lines 218.

9) The NULL wavefront propagates through the output register 204, because the downstream circuit (not shown), switched its "from next" signal line 214 to NULL in step 4 and because the feedback register DACK/NACK signal line 216 switched to NULL in step 7. The output register DACK/NACK signal line is now asserted, and the sequential circuit has complete one cycle.

The sequential circuit propagates alternating wavefronts of meaningful data and NULL. The feedback register 206 will store back-propagated state signals during the time when NULL signals propagate through the combinational circuit 201. The feedback register will back-propagate NULL while the combinational circuit 201 propagates meaningful data.

Figure 9A:
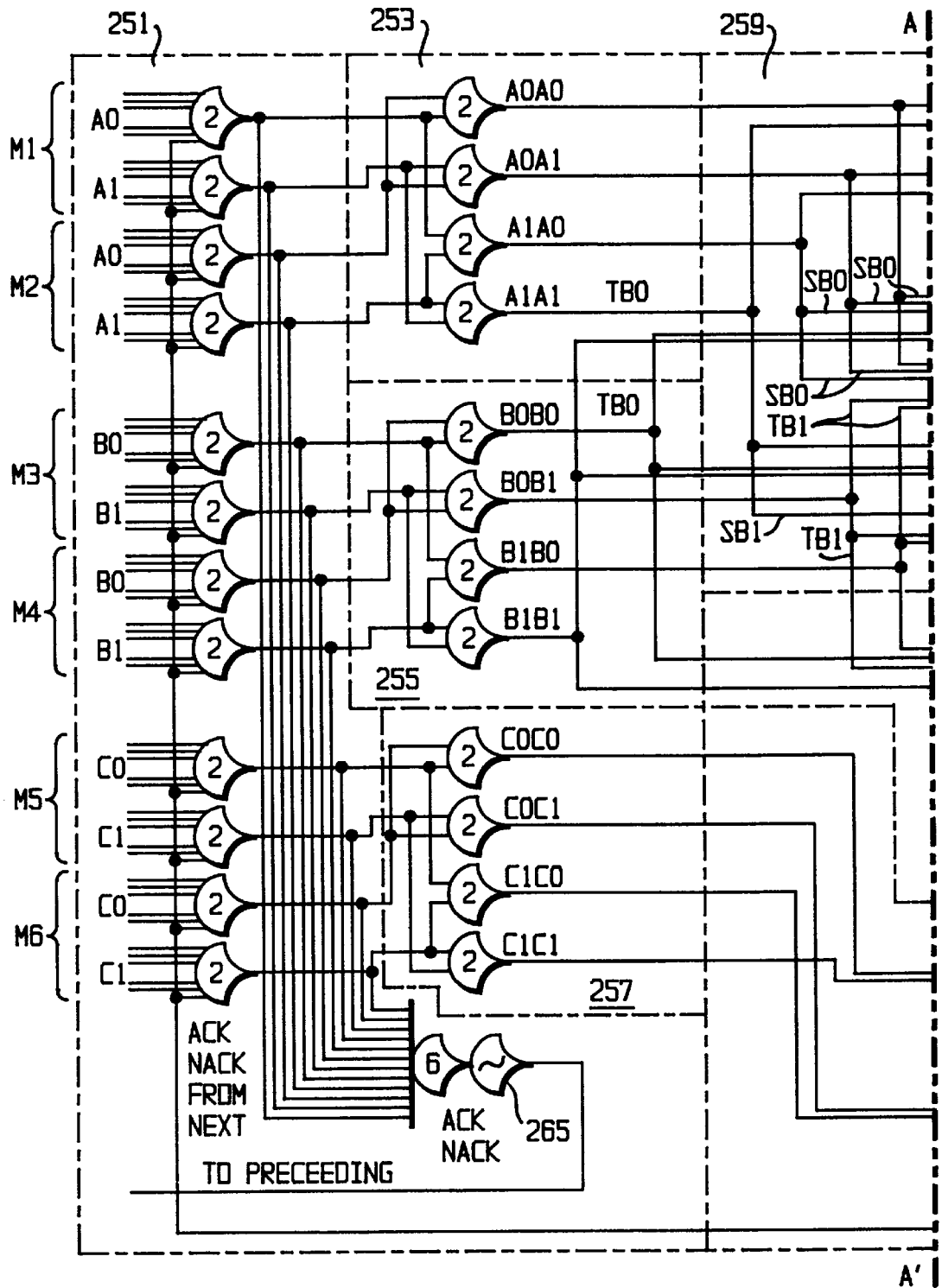
FIG. 9 illustrates a NULL convention three-bit adder with a distinct asynchronous register.
Figure 9B:
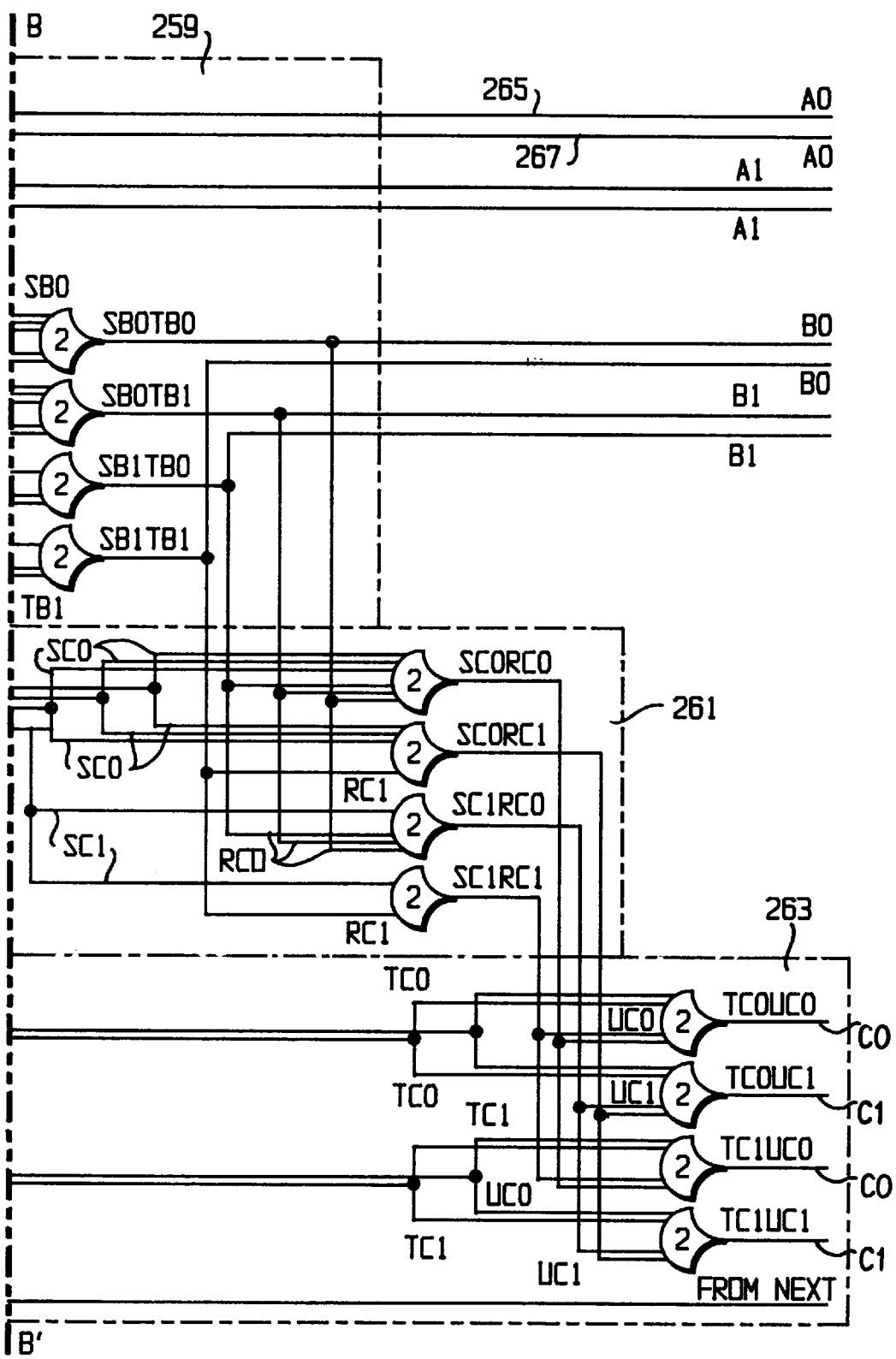
Figure 10A:
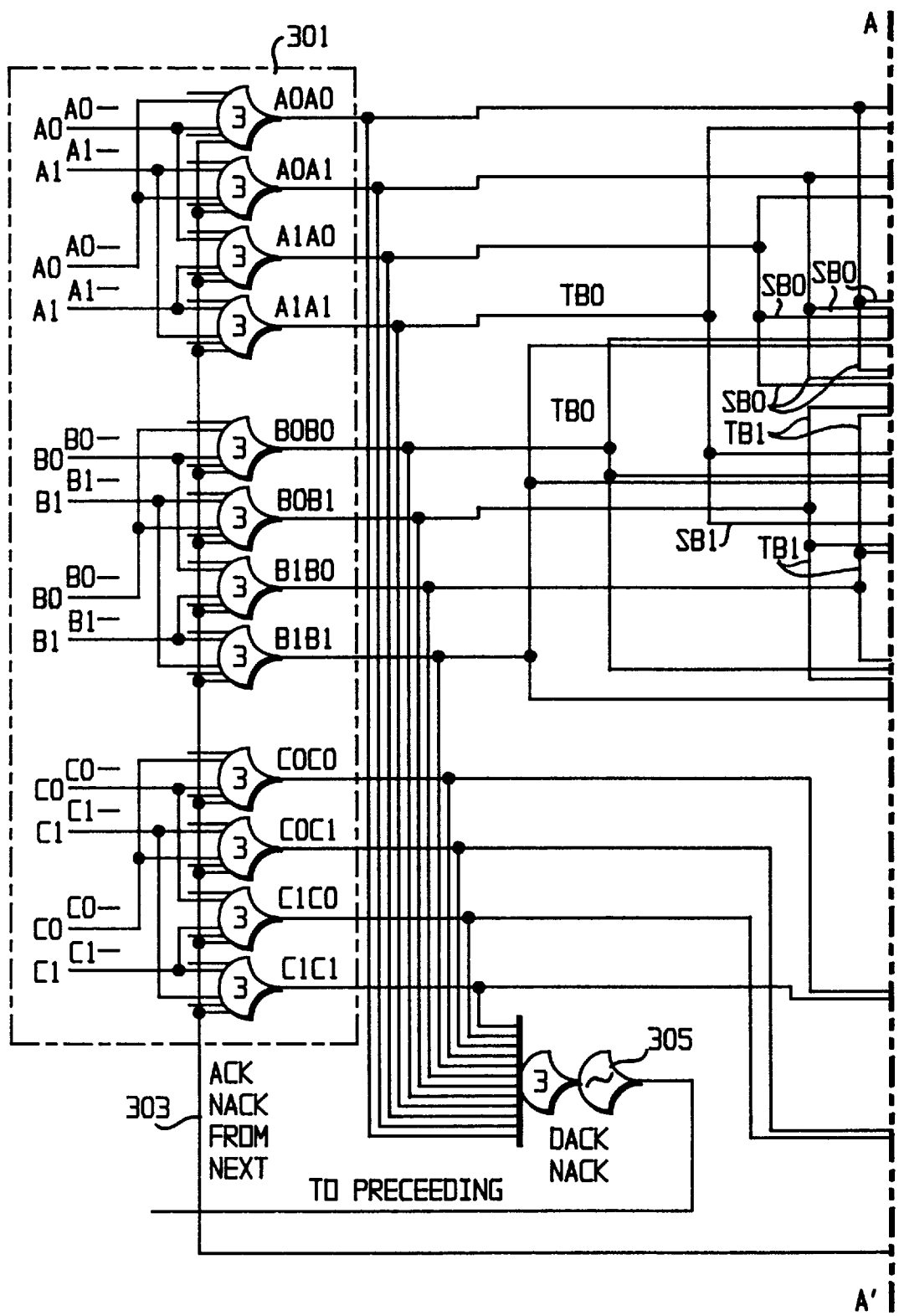
FIG. 10 illustrates a NULL convention three-bit adder with integrated asynchronous register.
Figure 10B:
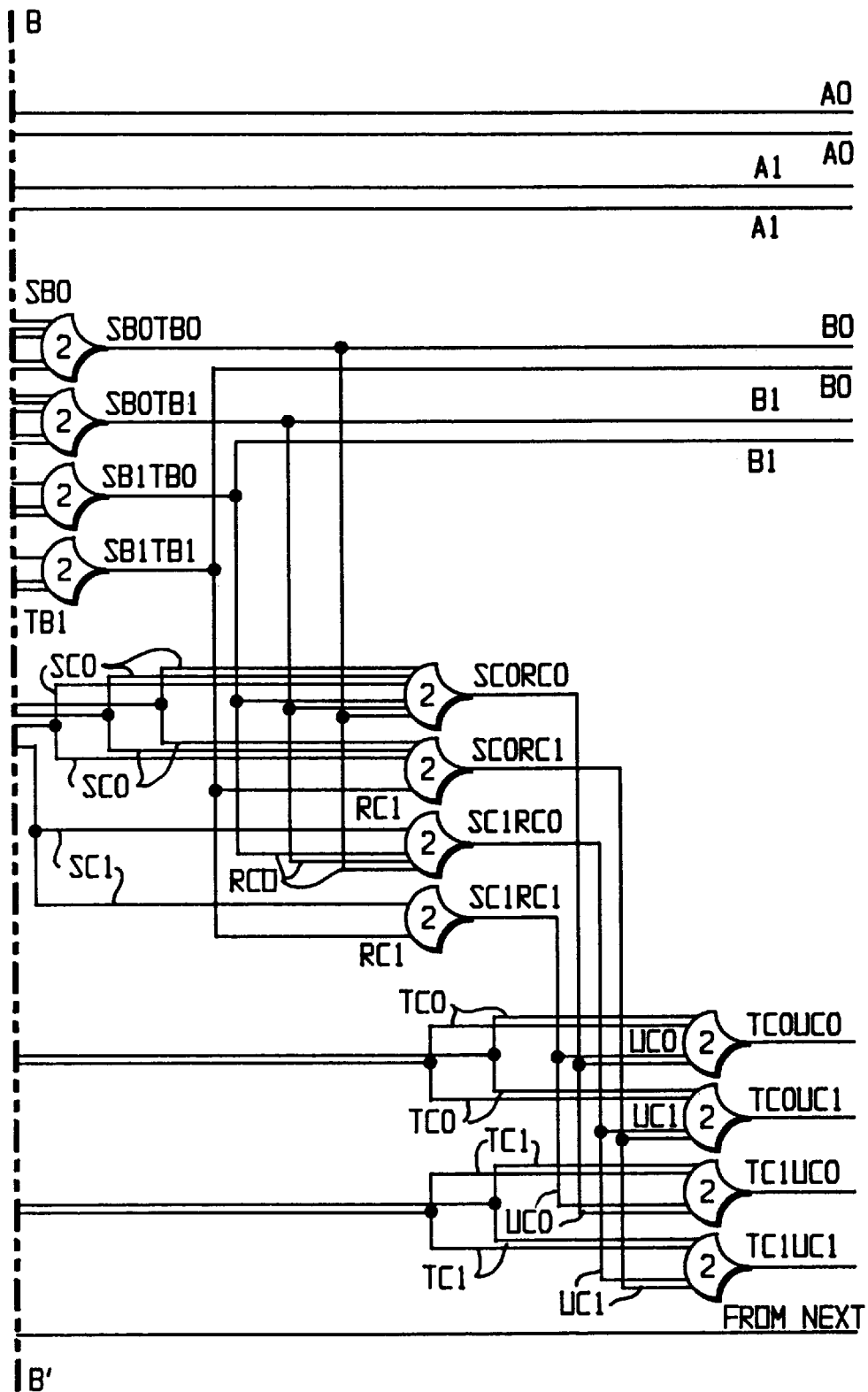

It is expected that NULL convention gate implementations can be optimized by integrating asynchronous registers with other circuitry. FIG. 9 illustrates a NULL convention three-bit adder with a distinct asynchronous register. FIG. 10 illustrates a NULL convention three-bit adder with integrated asynchronous register.

In FIG. 9, the asynchronous register 251 is illustrated as a distinct set of twelve, threshold-two gates and a threshold-six DACK/NACK monitor 265. The three bit adder is shown as three separate half-adders 253, 255, 257 and three additional sets of threshold-two gates 259, 261, 263.

The three half-adders each have four, threshold-two gates. Comparison of the half-adders of FIG. 9 and FIG. 3 illustrates a difference in illustration convention. In the half-adder of FIG. 3, a second tier of gates 39, 41, 43 were used to collect outputs from a first tier of gates 31, 33, 35, 37. The second tier of gates consolidated a number of signal lines of a mutually exclusive assertion group into a single signal line. For example, gate 39 had three input lines, but a single output line meaning "carry=zero." In the half adders of FIG. 9, corresponding second-tier gates have been omitted. Instead, multiple signal lines having the same meaning are given identical names. For example, two signal lines 265, 267 carry the name "A0'." These signal lines will be shown as collected in FIG. 11.

In FIG. 10, portions of the asynchronous register have been merged with the half-adders to leave a single set of input dates 301. More particularly, the threshold-two gates of the asynchronous register have been merged with the threshold-two gates of the half-adders. The result is twelve threshold-three gates 301 in place of twenty-four, threshold-two gates. Each of the threshold-three gates receives a common DACK/NACK 303 input signal from a downstream circuit (not shown). The outputs from the threshold-three gates 301 are all collected at the DACK/NACK monitor 305. Thus, the threshold-three gates perform the function of an asynchronous register (regulating wavefronts of meaningful data and NULL), as well as a logic function (of the half-adders).

Note that in FIG. 10, the DACK/NACK monitor 305 uses a threshold-three gate, as compared to FIG. 9 where the DACK/NACK monitor 265 uses a threshold-six gate. In FIG. 9, the asynchronous register inputs are made up of six mutually exclusive assertion groups M1–M6 and the asynchronous register outputs also form six mutually exclusive assertion groups. In FIG. 10, outputs from the combined register/adder 301 from three mutually exclusive assertion groups as a result of their half-adder logic function. This change results from the logic operations of the threshold-three gates (more particularly from the fact that interconnection complexity has moved upstream of the gates performing the asynchronous register function). This change can also be understood by referring to FIG. 3 and recognizing that the four outputs of the threshold-two gates 31, 33, 35, 37 make up a single mutually exclusive assertion group. Logic gate 31, for example, will only be asserted when input A is logic one and input B is logic one. Similarly, each of the four threshold-two gates represents a single one of the four possible input-value pairs: 00, 01, 10. 11. At most, only a single input-value pair will be asserted at a given time. (In NULL convention, of course, the inputs can also be all NULL.) Thus, each half-adder has two mutually exclusive assertion groups on the input, but only one mutually exclusive assertion group on the output.

Figure 11:
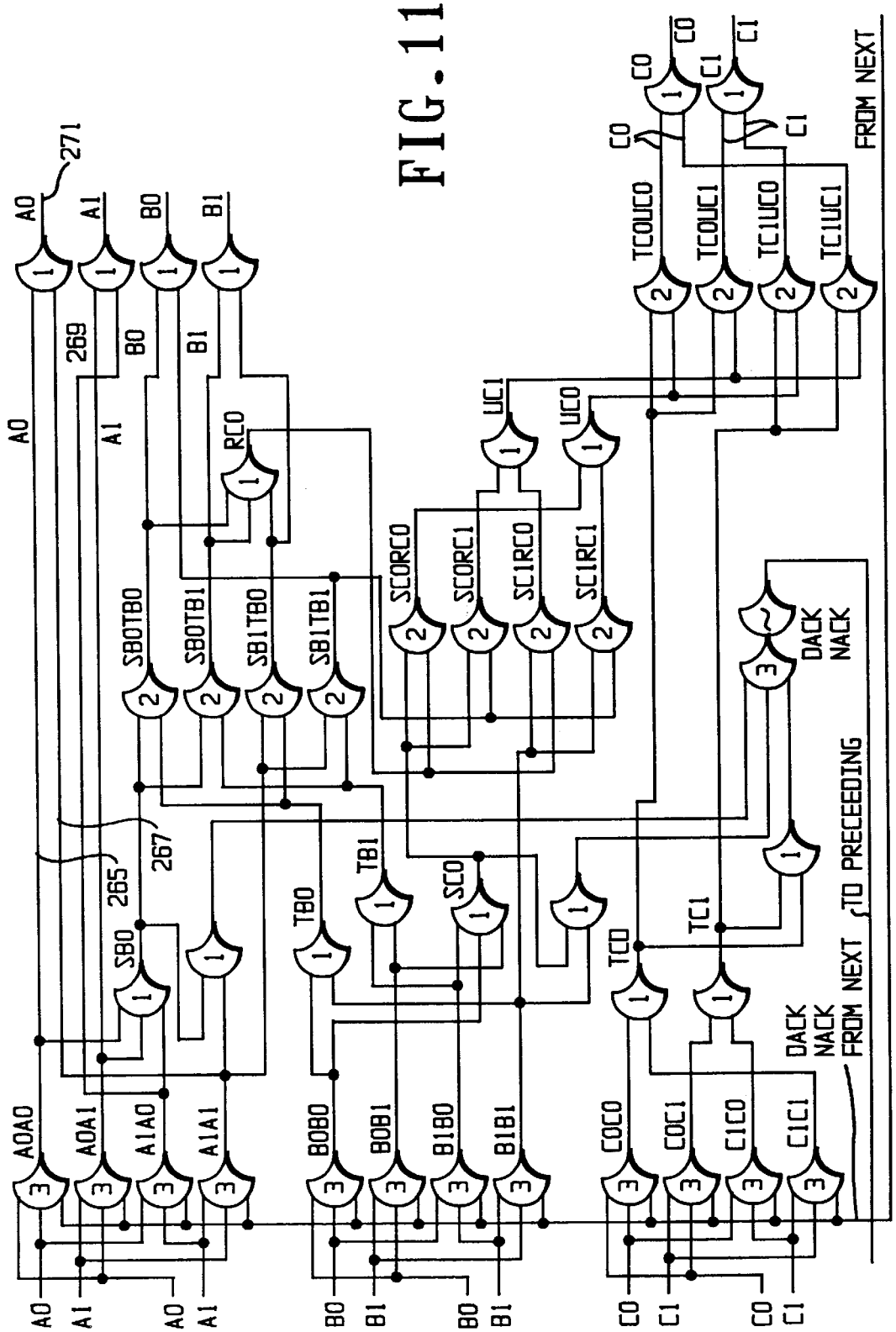
FIG. 11 illustrates implementation of an integrated asynchronous register/NULL convention three-bit adder with reduced interconnection.

FIG. 11 illustrates implementation of a NULL convention three-bit adder with reduced interconnection. A number of threshold-one gates have been added to consolidate multiple lines having the same meaning. For example, a threshold-one gate 269 reduces two "A0" signal lines 265, 267 into a single "A0'" signal line 271.

Transistor level circuits suitable for implementing NULL convention threshold gates can be found in copending U.S. patent application entitled "NULL CONVENTION THRESHOLD GATE", filed on even date herewith and incorporated herein by reference.

After learning of the embodiments described above, people practicing in this art will be able to make variations that fall within the spirit and scope of the invention. The embodiments described above are exemplary but not intended to limit unduly the scope of the invention as defined by the following claims.

What is claimed is:

1. An asynchronous register comprising:
   an input receiving a plurality of asynchronous data signals;
   an input receiving a control signal;
   a plurality of asynchronous storage elements, each asynchronous storage element generating an output signal in response to at least one of the plurality of asynchronous data signals and the control signal;
   wherein each asynchronous storage element is characterized by asserting a meaningful output when the asynchronous data signal and the control signal are meaningful, and holding the meaningful output until both the asynchronous data signal and the control signal are non-meaningful; and
   wherein each asynchronous storage element is further characterized by switching its output to a non-meaningful signal when the asynchronous data signal and the control signal are non-meaningful, and holding the non-meaningful output until both the asynchronous data signal and the control signal are meaningful.

2. An asynchronous circuit for storing logic values that are expressed on a plural set of transmission lines, where each transmission line may assume an asserted state having a logical meaning and a non-meaningful state that lacks a logical meaning, and where transmission lines are organized into at least one mutually exclusive assertion group, said mutually exclusive assertion group characterized by having at most one transmission line at a time in the asserted state, said asynchronous circuit comprising:
   a first plural set of input transmission lines grouped into at least one mutually exclusive assertion group;
   a first plural set of storage cells connected to the input transmission lines, said storage cells alternately storing logic values expressed on the input transmission lines and non-meaningful states;
   a first plural set of output transmission lines grouped into at least one mutually exclusive assertion group and expressing at least one logic value stored in the storage cells; and
   a first feedback circuit generating a first feedback signal, said first feedback signal transitioning to a first state when all output transmission lines are in the non-meaningful state and transitioning to a second state when a predetermined number output transmission lines are in the asserted state, wherein said predetermined number is greater than or equal to the number of mutually exclusive assertion groups in the output transmission lines and less than the number of output transmission lines.

3. The asynchronous circuit of claim 2, further comprising:
   a second feedback signal line connected to said first plural set of storage cells such that said first plural set of storage cells store meaningful data from said first plural set of input transmission lines when said second feedback signal line is in a first state, and said first plural set of storage cells store non-meaningful states when (i) said second feedback signal line is in a second state and (ii) said first plural set of input transmission lines are in the non-meaningful state.

4. The asynchronous circuit of claim 2, wherein a mutually exclusive assertion group comprises two transmission lines.

5. The asynchronous circuit of claim 2 wherein a mutually exclusive assertion group comprises more than two transmission lines.

6. The asynchronous circuit of claim 2, further comprising:
   a downstream circuit receiving logic values from the first plural set of storage cells and generating downstream circuit logic values on a plural set of downstream circuit output transmission lines grouped into at least one mutually exclusive assertion group;
   at least one set of downstream asynchronous storage cells, each set receiving a common set of downstream circuit output transmission lines, said downstream asynchronous storage cells storing downstream circuit logic values and expressing the downstream circuit logic values on downstream asynchronous storage output transmission lines; and
   at least one downstream feedback circuit, each downstream feedback circuit monitoring downstream asynchronous storage output transmission lines and generating a downstream feedback signal, each downstream feedback signal transitioning to a first state when all monitored downstream asynchronous storage output transmission lines monitored by the respective feedback circuit are in the non-meaningful state, and transitioning to a second state when a predetermined number of asynchronous storage output transmission lines greater than or equal to the number of mutual assertion groups of the output transmission lines and less than the number of transmission lines monitored by the respective feedback circuit become asserted.

7. The asynchronous circuit of claim 6 wherein said first plural set of asynchronous storage cells store non-meaningful states when (i) the at least one downstream feedback signal are in the second state and (ii) the first plural set of input transmission lines are non-meaningful, and wherein the first plural set of asynchronous storage cells store meaningful logic values when (i) the at least one feedback signals in the first state and (ii) the first plural set of input transmission lines express logic values.

8. The asynchronous circuit of claim 2, further comprising:
   at least one plural set of upstream storage cells each connected to a plural set of upstream input transmission lines and to a plural set of upstream output transmission lines organized as mutually exclusive assertion groups;

at least one upstream circuit, each upstream circuit connected to a respective one of the plural set of upstream storage cells, and each upstream circuit having at least one output line connected to a transmission line of first plural set of transmission lines.

9. The asynchronous circuit of claim 8, wherein said upstream storage cells express non-meaningful on said upstream output transmission lines when (i) said first feedback signal is in the second state and (ii) a connected plural set of upstream input transmission lines are non-meaningful, and wherein said upstream storage cells express meaningful logic values on said upstream output transmission lines when (i) said first feedback signal is in the first state and (ii) a connected plural set of upstream input transmission lines express a logic value.

10. A method of storing a logic value in storage cells, where each storage cell is capable of assuming an asserted storage state having a logical meaning and a non-meaningful storage state that lacks logical meaning, the method comprising steps of:

establishing a first plural set of cells in the non-meaningful storage state;

expressing a first logic value on a first plural set of transmission lines, where each of the first plural set of transmission lines may assume an asserted state having a logical meaning and a non-meaningful state that lacks logical meaning, and where the first plural set of transmission lines are organized into a mutually exclusive assertion group characterized by having at most one transmission line at a time in the asserted state at a time;

communicating the first logic value expressed on the first plural set of transmission lines to the first plural set of storage cells at a time when all of the first plural set of storage cells are in the non-meaningful storage state; and storing the first logic value by switching at least one storage cell of the first plural set of storage cells from the non-meaningful storage state to the asserted storage state.

11. The method of claim 10, further comprising the steps of:

placing all storage cells of the first plural set of storage cells in the non-meaningful state after storing the first logic value;

communicating a second logic value to the first plural set of storage cells at a time when all of the first plural set of storage cells are in the non-meaningful storage state; and storing the second logic value in the first plural set of storage cells by switching at least one storage cell from the non-meaningful storage state to the asserted storage state.

12. The method of claim 10, further comprising the step of:

indicating whether a predetermined number of storage cells are in the asserted storage state.

13. The method of claim 11, further comprising the step of:

indicating whether all the storage cells are in the non-meaningful storage state.

14. The method of claim 11, further comprising the steps of:

communicating the storage states of the first plural set of storage cells to at least one downstream circuit;

communicating the output of the downstream circuit to at least one second plural set of storage cells, where each storage cell of the at least one second set of storage cells is capable of assuming an asserted storage state having a logical meaning and a non-meaningful storage state that lacks logical meaning; and storing the output of the downstream circuit in both the second and third plural sets of storage elements.

15. The method of claim 14 wherein the step of storing the first logic value occurs at a time when all storage cells of the second and third plural sets of storage cells are in the non-meaningful storage state.

16. The method of claim 14 wherein the step of placing all storage cells of the first plural set of storage cells in the non-meaningful state occurs when at least one storage cell of the at least one second plural set of storage cells is in the asserted storage state.

17. The method of claim 16 wherein the downstream circuit performs no logic operation.

* * * * *